United States Patent
Bayruns et al.

(10) Patent No.: US 9,553,551 B1
(45) Date of Patent: Jan. 24, 2017

(54) WIDE-BAND AMPLIFIERS USING CLIPPER CIRCUITS FOR REDUCED HARMONICS

(71) Applicant: ANADIGICS, INC., Warren, NJ (US)

(72) Inventors: Robert Bayruns, Bridgewater, NJ (US); Tim Gittemeier, Suwanee, GA (US)

(73) Assignee: Skyworks Solutions, Inc., Woburn, MA (US)

( * ) Notice: Subject to any disclaimer, the term of this patent is extended or adjusted under 35 U.S.C. 154(b) by 154 days.

(21) Appl. No.: 14/276,400

(22) Filed: May 13, 2014

Related U.S. Application Data (60) Provisional application No. 61/824,047, filed on May 16, 2013.

(51) Int. Cl.
  *H03F 3/04* (2006.01)
  *H03F 3/19* (2006.01)
  *H03F 3/21* (2006.01)

(52) U.S. Cl.
  CPC ...... *H03F 3/19* (2013.01); *H03F 3/21* (2013.01); *H03F 2200/429* (2013.01); *H03F 2200/451* (2013.01)

(58) Field of Classification Search
  CPC ........................................................ H03F 3/04
  USPC .................................. 330/306, 277, 250, 149
  See application file for complete search history.

(56) References Cited

U.S. PATENT DOCUMENTS

| | | | | |
|---|---|---|---|---|
| 3,585,519 A | * | 6/1971 | Burgess | H03F 3/191 327/557 |
| 3,863,170 A | * | 1/1975 | Ratcliff | H03F 3/2176 327/170 |
| 5,977,823 A | * | 11/1999 | Inoue | H03F 1/523 327/325 |
| 2004/0232983 A1 | * | 11/2004 | Cheung | H03H 17/0261 330/149 |
| 2009/0116663 A1 | * | 5/2009 | Buuck | H03F 3/217 381/94.8 |
| 2010/0264992 A1 | * | 10/2010 | Hongo | H03F 1/0222 330/297 |
| 2011/0181362 A1 | * | 7/2011 | Iwamatsu | H03F 1/3211 330/282 |
| 2013/0136278 A1 | * | 5/2013 | Quilter | G10H 3/187 381/118 |
| 2013/0241656 A1 | * | 9/2013 | Tajima | H03F 3/68 330/295 |
| 2014/0340155 A1 | * | 11/2014 | Berndsen | H03F 1/0277 330/291 |

* cited by examiner

*Primary Examiner* — Patricia T Nguyen
(74) *Attorney, Agent, or Firm* — Kelley Drye & Warren LLP (57) ABSTRACT

The present invention breaks up the frequency bands which can be filtered by a simple low-loss band-pass or low pass filter. The second harmonic frequency is reduced by use of a non-linear clipper element which controls the driving waveform symmetry and can reduce the harmonics by as much as 5-15 db which makes the filter much simpler and allows the amplifier to remain wide-band. The output waveform from the amplifier is symmetrical or nearly symmetrical.

20 Claims, 8 Drawing Sheets

Time Domain a. Pulse $d = k/T$ b. Square

Frequency Domain $a_0 = A\,d$ $a_n = \dfrac{2A}{n\pi}\sin(n\pi d)$ $b_n = 0$

($d = 0.27$ in this example)

$a_0 = 0$ $a_n = \dfrac{2A}{n\pi}\sin\left(\dfrac{n\pi}{2}\right)$ $b_n = 0$ (all even harmonics are zero)

WIDE-BAND AMPLIFIERS USING CLIPPER CIRCUITS FOR REDUCED HARMONICS

The application claims benefit of provisional application Ser. No. 61/824,047, filed May 16, 2013, for "WIDEBAND AMPLIFIER USING CLIPPER CIRCUITS FOR REDUCED HARMONICS," the contents of which are incorporated herein by reference.

BACKGROUND

Wide-band amplifiers can reduce system costs and provide improved performance in many applications. Envelope tracking techniques can provide linear performance of wide-band amplifiers by running them deep into saturation. The improvement in efficiency is substantial with, for example, a 10%-20% improvement with LTE signals.

The problem for wide-band, envelope tracking amplifiers is that driving transistors deep into saturation produces substantial harmonics that can interfere with many receiving systems. While filter circuits can be used to reduce such harmonics, this results in reduced bandwidth and requires many discrete surface mount devices (SMDS). The additional filter circuits add power loss to the system and reduce the power amplifier efficiencies. A low pass, or band pass, filter can be used at the output of the amplifier to roll off the harmonics to acceptable levels. The hardest harmonic to filter is the second harmonic since it is the closest in frequency to the fundamental frequency. Typical power amplifier specifications require the second harmonic content to be 30-40 dbc.

SUMMARY

The present invention breaks up the frequency bands that can be filtered by a simple low-loss band pass or low pass filter. The second harmonic frequency is reduced by use of a non-linear clipper element that controls the driving waveform and can reduce the harmonics by as much as 5-15 db which makes the filter much simpler and allows the amplifier to remain wide-band. The output waveform from the amplifier is symmetrical or nearly symmetrical.

BRIEF DESCRIPTION OF THE DRAWINGS

These and other objects and advantages of the present invention will be apparent to those of ordinary skill in the art in view of the following detailed description in which.

DETAILED DESCRIPTION

Figure 1:
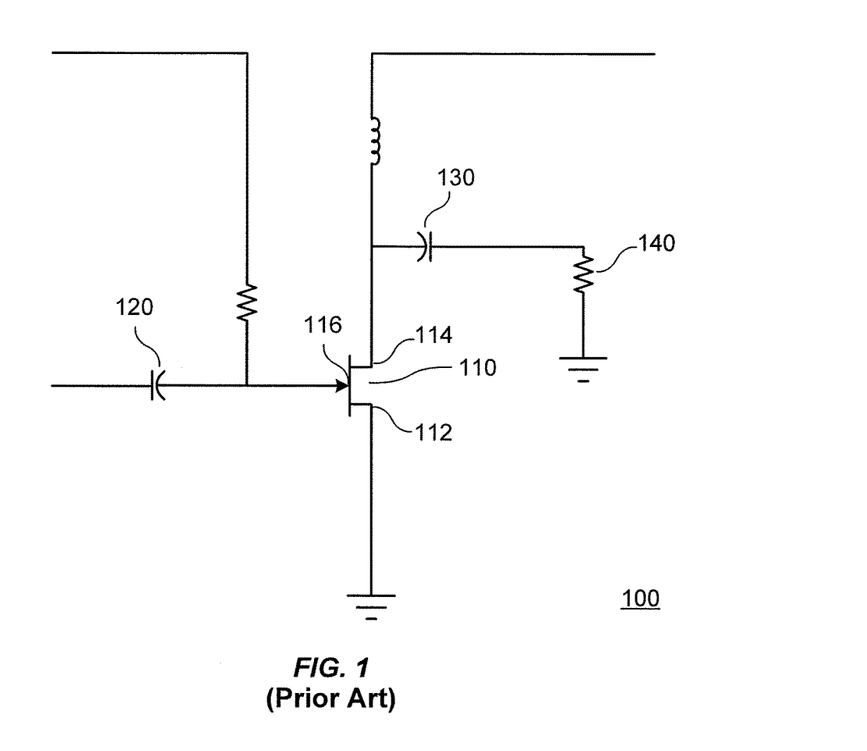
FIG. 1 is a schematic diagram of a basic common source amplifier.

Conventional silicon bipolar, HBT, JFET, MESFET and PHEMT devices suffer from the inherent problem that they have a diode element in their input controlling element such as the base or gate terminal. An illustrative prior art PHEMT circuit 100 is shown in FIG. 1. Circuit 100 depicts a basic common source amplifier comprising a PHEMT transistor 110 having first, second, and third terminals 112, 114, 116, a first DC blocking capacitor 120 at the input of the circuit, a second DC blocking capacitor 130 at the output of the circuit, and a load 140. The PHEMT transistor has source and drain regions coupled to the first and second terminals 112 and 114 and a gate coupled to the third terminal 116

When the RF input voltage swing becomes large enough to forward bias the gate diode, the input voltage is clamped to about 0.7V and the excess voltage is stored across the first DC blocking capacitor 120. This forces the gate voltage to swing very far negative, such that the "ON" to "OFF duty cycle is not 50%.

Figure 2:
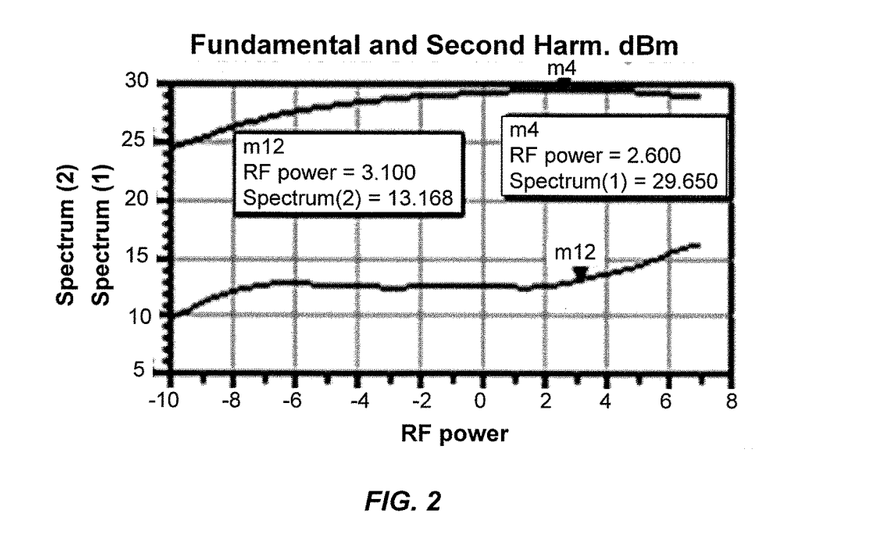
FIGS. 2-4 depict certain simulated waveforms for the circuit of FIG. 1.
Figure 3:
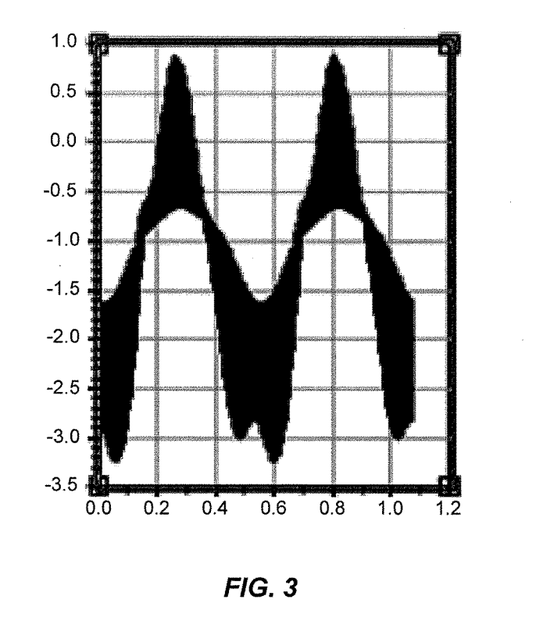
Figure 4:
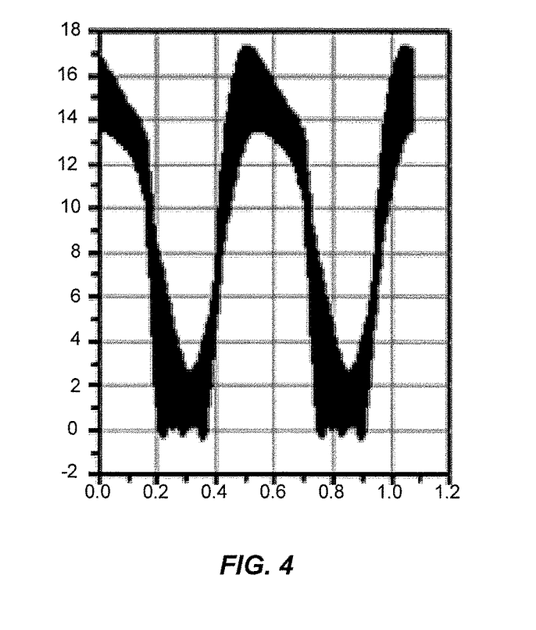

FIG. 2 is a simulation depicting the fundamental power and second harmonic power where the output power ranges from about 24 dBm to about 30 dBm. Deep into compression the second harmonic power is as much as 17 dbm. FIG. 3 depicts the gate terminal voltage swinging from about −3.1V to +0.7V. FIG. 4 depicts the output waveform swinging from about +0.3V to +17V. The output waveform depicted in FIG. 4 has a narrow bottom and wider top resulting in a second harmonic product which is difficult to filter.

Figure 5:
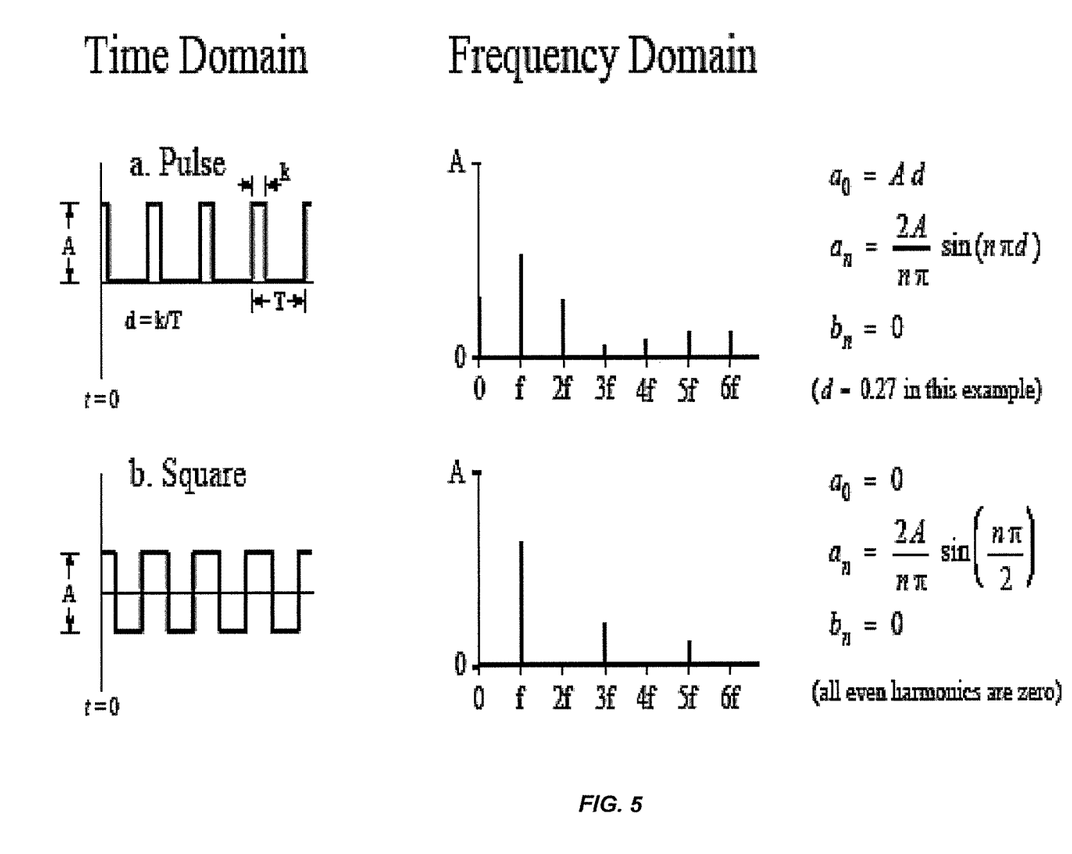
FIG. 5 depicts time domain and frequency spectra of square and rectangular waveforms.

Waveforms that are symmetrical have no even order distortion as shown with the square wave in FIG. 5.

Figure 6:
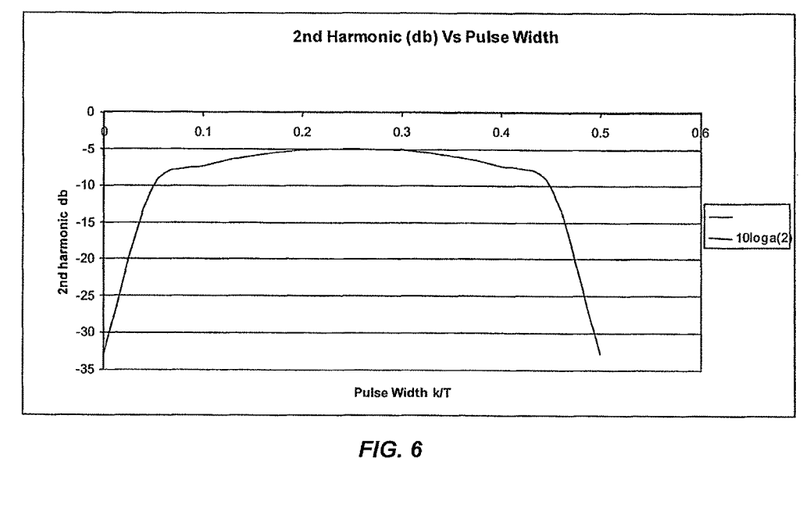
FIG. 6 is a plot of the second harmonic versus pulse width.

FIG. 6 shows the second harmonic level of the rectangular wave Vs duty cycle (d). As can be seen, if d can be kept to about 0.425 to 0.45, the second harmonic rejection can be ~10 db.

Figure 7:
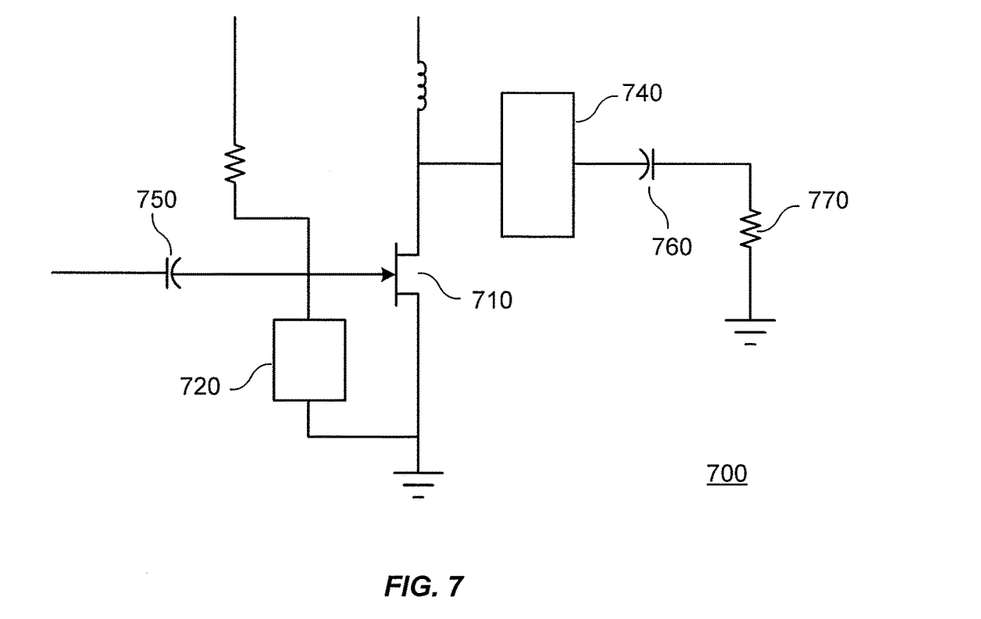
FIG. 7 is a schematic diagram of a first illustrative embodiment of the invention.

FIG. 7 is a schematic diagram depicting a first illustrative embodiment of an amplifier circuit 700 of the invention. Circuit 700 comprises a power amplifier 710, a negative clipping element 720 at the gate or base terminal of power amplifier 710 to control the duty cycle and even order harmonics at the power amplifier output, and a wide-band band pass filter (BPF) or a low pass filter (LPF) 740 to filter out the remaining harmonics. Circuit 700 also comprises a first DC blocking capacitor 750 at its input, a second DC blocking capacitor 760 at its output, and a load 770. Amplifier 710 can be either a bipolar transistor or a field effect transistor, as shown, each having first, second and third terminals 712, 714, 716. In the case of a bipolar transistor, the first and second terminals are coupled to an emitter and a collector of the transistor; and the third terminal is coupled to a base of the transistor. In the case of a field effect transistor, the first and second terminals are coupled to source and drain regions of the transistor and the third terminal to a gate. In either case, a signal applied to the third terminal controls current flow between the first and second terminals.

To make the system wide band, filter 740 is designed to have roughly the same impedance as the impedance of load 770 (within a ~10 db return loss).

The negative clipping element 720 together with the output filter 740 provides a very wide-band amplifier of high output power with good harmonic rejection and low-loss. It is envisioned for instance, an amplifier using this invention could achieve adequate performance to cover EUTRAN bands (5, 6, 8, 12, 13, 14, 17, 18, 19, 20, 26) or EUTRAN bands (1, 2, 3, 9, 10, 25, 33, 35, 36, 37, 39) assuming each band is routed to an appropriate system filter to meet FCC (or similar) specifications.

Other applications of the wide-band amplifier of the present invention include its use in envelope tracking systems, in envelope elimination and restoration systems, and in polar modulation systems.

Figure 8:
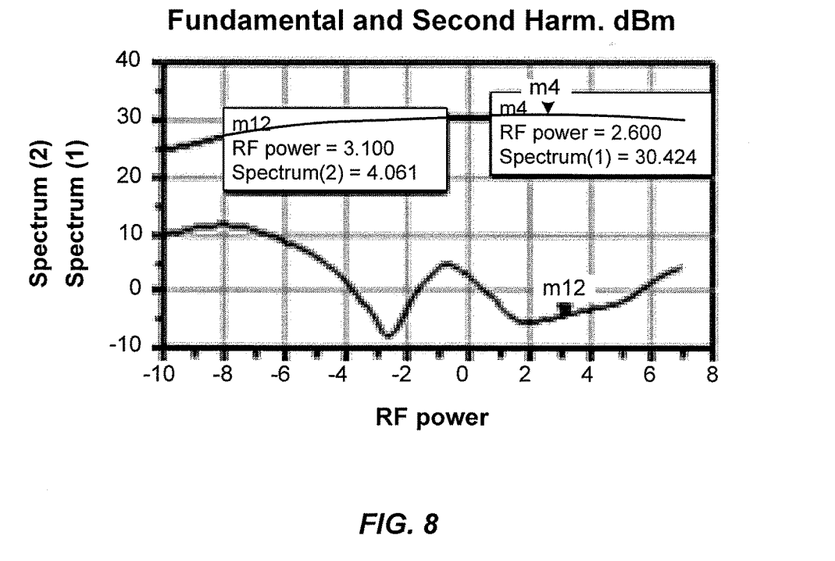
FIGS. 8-12 depict certain simulated waveforms for the circuit of FIG. 7.
Figure 9:
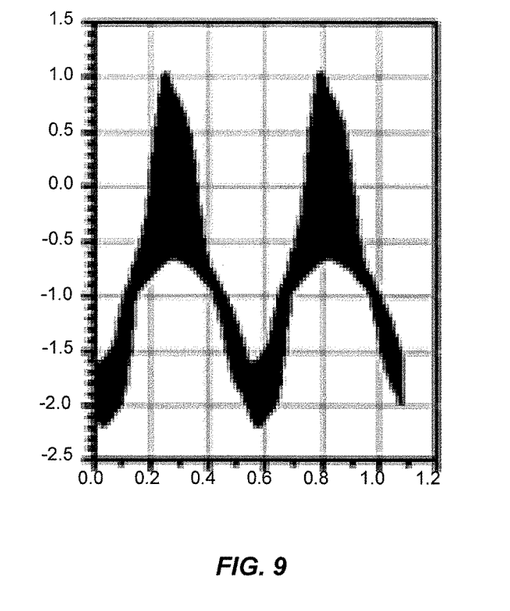
Figure 10:
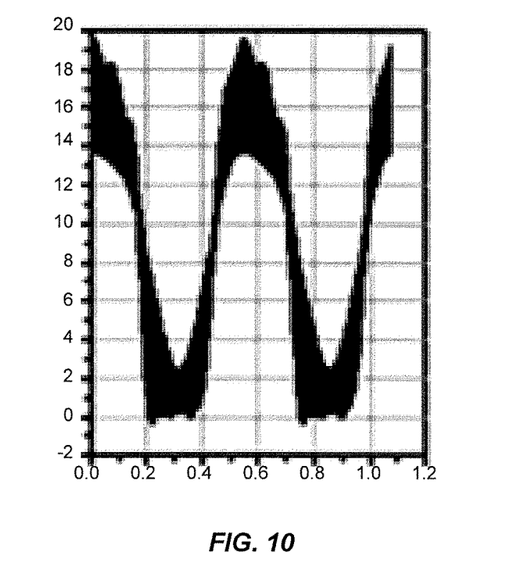
Figure 11:
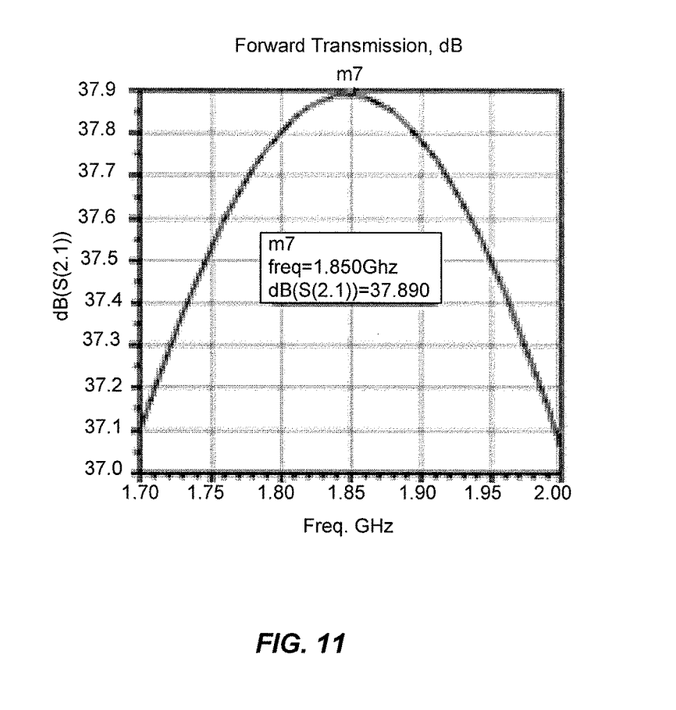
Figure 12:
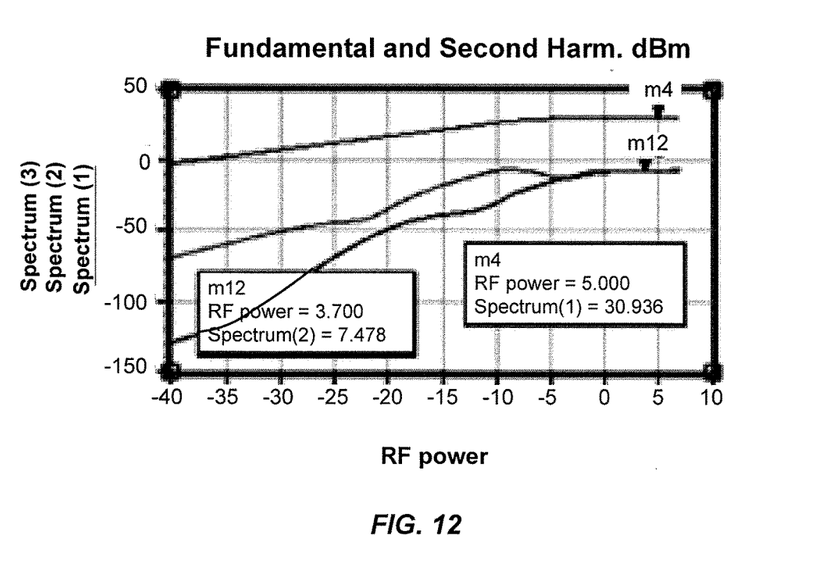

As shown in the plots of FIG. 8, computer simulations of the circuit of FIG. 7 using two series PHEMT diodes (~1.4V) show a second harmonic in deep saturation (>30 dbm) that reduces the signal power from ~13 dbm to 17 dbm to −5 dbm to −4 dbm. FIG. 9 depicts the gate terminal voltage swinging from about −2.2 V to 1 V. FIG. 10 depicts the output waveform swinging from about 0 V to 20 V. As can be seen in FIG. 10, the output waveform is symmetrical or nearly symmetrical Further results of computer simulation are shown in FIGS. 11 and 12. S Parameters are of a full amplifier with 37 db gain that covers a bandwidth of 1710 MHz-1980 MHz as depicted in FIG. 11. The second harmonic distortion gives a rejection of >35 dbc.

Figure 13:
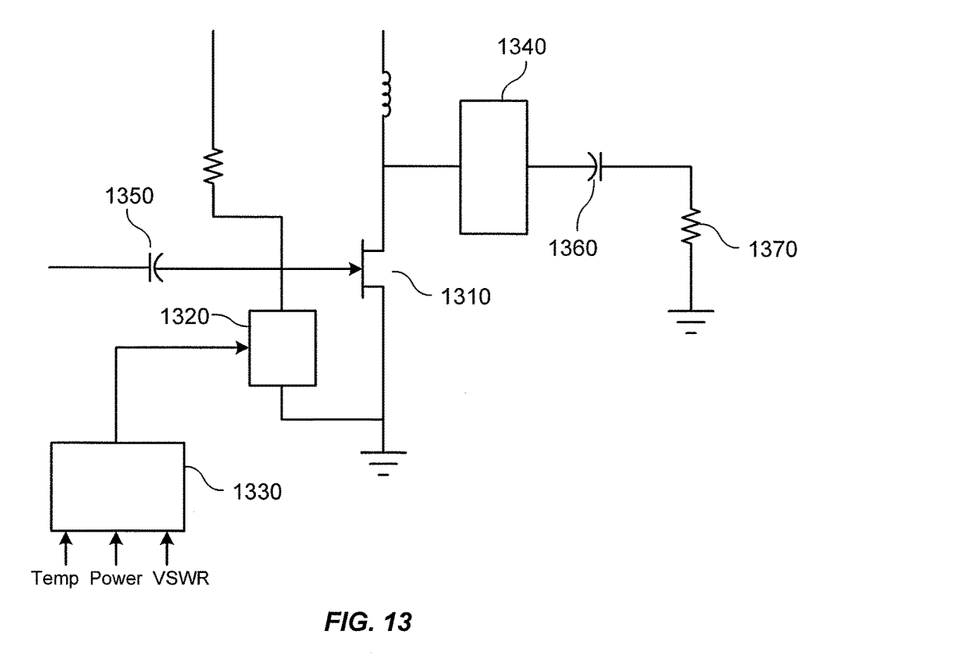
FIG. 13 is a schematic diagram of a second illustrative embodiment of the invention.

FIG. 13 depicts a second illustrative embodiment of a circuit 1300 of the invention that uses a voltage variable clipper element. Circuit 1300 comprises a power amplifier 1310, a voltage variable clipping element 1320 at the gate or base terminal of power amplifier 1310 to control the duty cycle and even order harmonics at the power amplifier output, a voltage generator 1330, and a wide-band band pass filter (BPF) or a low pass filter (LPF) 1340 to filter out the remaining harmonics. Circuit 1300 also comprises a first DC blocking capacitor 1350 at its input, a second DC blocking capacitor 1360 at its output, and a load 1370. Again, amplifier 1310 can be either a bipolar transistor or a field effect transistor, as shown, each having first, second and third terminals 1312, 1314, 1316 coupled to an emitter, collector and base of the bipolar transistor or to the source, drain and gate of the field effect transistor. In either case, a signal applied to the third terminal controls current flow between the first and second terminals.

Figure 14:
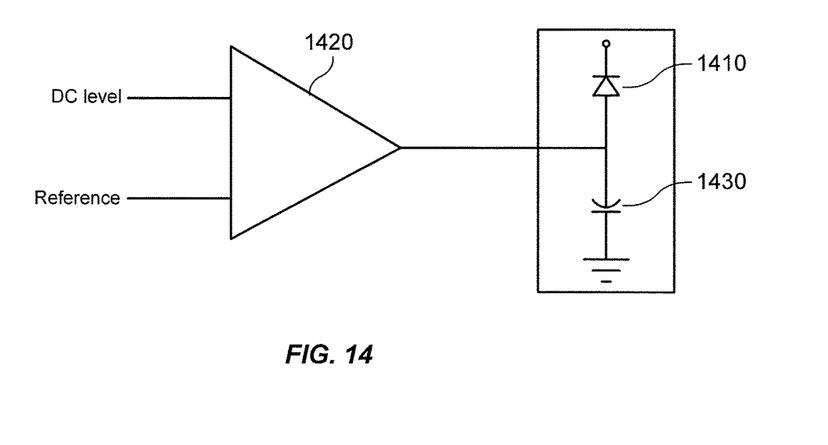
FIG. 14 is a schematic diagram of an element of the circuit of FIG. 13.

The operation of circuit 1300 is similar to that of circuit 700 but the output of clipping element 1320 and therefore the second harmonic level is responsive to a control voltage supplied by voltage generator 1330. The output of the voltage generator can be controlled so that it is responsive to a number of factors such as temperature, output power, and/or VSWR under mismatch. Thus, the second order harmonic level can made to depend on such factors as temperature, output power, and VSWR under mismatch. The clipping voltage can be programmed; or the clipping voltage can be supplied by an adaptive feedback loop The voltage variable clipper circuit can be made from any number of diodes, but in this case a GaAs Schottky diode is preferable. FIG. 14 depicts a diode 1410 in series with a variable voltage source 1420 such as an OP AMP and a capacitor 1430 to GND to make a low impedance voltage source to the negative clipping diode. Diode 1410 can be implemented in a variety of different forms such as a base-emitter, base collector, silicon PN junctions, germanium PN junctions, or JFET diode The resulting clipping voltage will be the built-in voltage plus/minus the voltage source voltage.

As will be apparent to those skilled in the art, numerous variations may be practiced within the spirit and scope of the present invention.

What is claimed is:

1. A wideband amplifier comprising:
   a transistor having first, second and third regions where a signal applied to the third region controls current flow between the first and second regions;
   a negative waveform clipping element coupled to the third region to shape a peak-to-peak amplitude of the signal applied to the third region and reduce a second harmonic of the signal; and
   a wideband band pass filter (BPF) or low pass filter (LPF) coupled to an output of the amplifier to reduce harmonic levels.

2. The wideband amplifier of claim 1 wherein the transistor is a MOS device in which the first and second regions are source and drain regions and the third region is a gate.

3. The wideband amplifier of claim 1 wherein the transistor is a bipolar device in which the first and second regions are an emitter and a collector and the third region is a base.

4. The wideband amplifier of claim 1 wherein the waveform clipping element produces a symmetrical or near symmetrical output waveform.

5. The wideband amplifier of claim 1 wherein the waveform clipping element is a programmable waveform clipping element.

6. The wideband amplifier of claim 1 wherein the waveform clipping element is an adaptive waveform clipping element.

7. The wideband amplifier of claim 1 wherein the waveform clipping element comprises at least one diode and a voltage source.

8. The wideband amplifier of claim 7 wherein said at least one diode is selected from the group consisting of base-emitter, base collector, silicon PN junctions, germanium PN junctions, JFET diodes.

9. The wideband amplifier of claim 1 wherein the waveform clipping element is a nonlinear clipping element.

10. A wideband amplifier comprising:
    a transistor having first, second and third terminals where a signal applied to the third terminal controls current flow between the first and second terminals;
    a negative waveform clipping element coupled to the third terminal to shape a peak-to-peak amplitude of the signal applied to the third terminal and to reduce a second harmonic of the signal; and
    a wideband band pass filter (WBF) or a low pass filter (LPF) coupled to an output of the amplifier to reduce harmonic levels.

11. The wideband amplifier of claim 10 wherein the transistor is a MOS device in which the first and second terminals are coupled to source and drain regions and the third terminal is coupled to a gate.

12. The wideband amplifier of claim 10 wherein the transistor is a bipolar device in which the first and second terminals are coupled to emitter and collector regions and the third terminal is coupled to a base.

13. The wideband amplifier of claim 10 wherein the waveform clipping element produces a symmetrical or near symmetrical output waveform.

14. The wideband amplifier of claim 10 wherein the waveform clipping element is a programmable waveform clipping element.

15. The wideband amplifier of claim 10 wherein the waveform clipping element is an adaptive waveform clipping element.

16. The wideband amplifier of claim 10 wherein the waveform clipping element comprises at least one diode and a voltage source.

17. The wideband amplifier of claim 16 wherein said at least one diode is selected from the group consisting of base-emitter, base collector, silicon PN junctions, germanium PN junctions, JFET diodes.

18. The wideband amplifier of claim 10 wherein the waveform clipping element is a nonlinear clipping element.

19. The wideband amplifier of claim 7 wherein the variable voltage source is an operational amplifier and a capacitor.

20. The wideband amplifier of claim 16 wherein the variable voltage source is an operational amplifier and a capacitor.

\* \* \* \* \*